United States Patent [19]

Oida

[11] Patent Number: 4,529,891
[45] Date of Patent: Jul. 16, 1985

[54] COMPARATOR CIRCUIT

[75] Inventor: Yoshio Oida, Funabashi, Japan

[73] Assignee: Tokyo Shibaura Denki Kabushiki Kaisha, Kawasaki, Japan

[21] Appl. No.: 367,664

[22] Filed: Apr. 12, 1982

[30] Foreign Application Priority Data

Apr. 17, 1981 [JP] Japan .................................. 56-57138

[51] Int. Cl.³ ............................................. H03K 5/24
[52] U.S. Cl. .................... 307/355; 307/362; 330/257
[58] Field of Search ............... 307/362, 350, 494, 354; 330/252, 257

[56] References Cited

U.S. PATENT DOCUMENTS

| | | | | |
|---|---|---|---|---|
| 3,988,595 | 10/1976 | Eatock | ................................. | 307/362 |
| 4,013,898 | 3/1977 | Makino | ............................... | 307/362 |
| 4,295,063 | 10/1981 | Price, Jr. | ............................. | 307/362 |
| 4,338,527 | 7/1982 | Nagano | ............................... | 307/494 |
| 4,339,674 | 7/1982 | Hashimoto | ......................... | 307/362 |
| 4,418,290 | 11/1983 | Nagano | ............................... | 307/362 |

Primary Examiner—Stanley D. Miller
Assistant Examiner—Timothy P. Callahan
Attorney, Agent, or Firm—Finnegan, Henderson, Farabow, Garrett & Dunner

[57] ABSTRACT

A comparator circuit comprising an operational amplifier for comparing a reference input signal at a given voltage and an input signal at an unknown voltage to produce a signal representing the result of the comparison, a first constant current source for feeding a constant current to the operational amplifier, an output transistor, having its base connected to the output of the operational amplifier, for controlling the output of the circuit, and a second constant current source for feeding a constant current to the base of the output transistor. This configuration enables the comparator circuit to operate normally, even when the input voltage is less than the reference voltage and is equal to zero.

3 Claims, 2 Drawing Figures 4,529,891

1

COMPARATOR CIRCUIT

BACKGROUND OF THE INVENTION

The present invention relates to a comparator circuit for comparing an unknown input voltage with a known input voltage to produce an output signal representing the result of the comparison.

A prior comparator circuit will be described referring to FIG. 1. The emitters of PNP transistors Q1 and Q2 are connected together to a first power source providing a positive potential Vcc, through a constant current source 1. A reference input signal of given reference voltage Vref is applied to the base of the transistor Q1, through the first input terminal 2. An input signal at an unknown voltage Vin is applied to the base of the transistor Q2, through the second input terminal 3. The collectors of the transistors Q1 and Q2 are connected to the collectors of NPN transistors Q3 and Q4, respectively. The transistors Q3 and Q4 cooperate to form a current mirror circuit. The transistors Q3 and Q4 are so arranged that their emitters are grounded, the bases are interconnected, and the collector of the transistor Q3 is connected to the common base of the transistors Q3 and Q4. With such a current mirror arrangement, the emitter current of the transistor Q4 is the same as that of the transistor Q3. Transistors Q1 to Q4 constitute an operational amplifier 4.

Further, an output transistor Q5 of NPN type having a grounded emitter is connected at its base to the collector of the transistor Q4 of the operational amplifier 4. The collector of transistor Q5 is connected to a power source providing a potential Vcc through a resistor 5, and serves as an output terminal 6.

The operation of the illustrated known comparator circuit, assuming application of a reference input signal Vref and an unknown input signal Vin, will be described. When Vin>Vref, the transistor Q1 is conductive while the transistor Q2 is nonconductive. Accordingly, a current $I_{E1}$ from the constant current source 1 flows through the emitter-collector path of the transistor Q1 and is amplified to value of $\alpha I_{E1}$. $\alpha$ is the current amplification factor of the transistor Q1. The current $\alpha I_{E1}$ flows into the transistor Q3, too. The transistors Q3 and Q4 form the current mirror circuit. However, a current of the same value as the current $\alpha I_{E1}$ will now flow into the collector-emitter path of the transistor Q4 through the emitter-collector path of the transistor Q2, because the transistor Q2 is nonconductive. No current is fed from the constant current source 1. The charge stored in the base of the transistor Q5 (the charge stored in the stray capacitance 7 equivalently connected between the base of the transistor Q5 and ground in FIG. 1) discharges through the collector-emitter path of the transistor Q4. As a result, the output transistor Q5 becomes nonconductive since the base-emitter voltage is 0 V. And the output terminal 6 becomes high in potential (the difference between the potential Vcc and the voltage drop across the resistor 5).

When Vin<Vref, the transistor Q1 is nonconductive, while the transistor Q2 is conductive. Accordingly, the current $I_{E1}$ from the constant current source 1 flows through the emitter-collector path of the transistor Q2 and is amplified to a value of $\alpha I_{E1}$. Here, $\alpha$ is the current amplification factor of the transistor Q2. Since the transistor Q1 is nonconductive, no current flows through the transistor Q1 or the transistor Q3. Therefore, the base-emitter voltage of the transistor Q3 is 0 V. Then,

2 the transistor Q4 which cooperates with the transistor Q3 to form the current mirror circuit, becomes nonconductive. The current $\alpha I_{E1}$ amplified by the transistor Q2 flows into the base of the transistor Q5 to render the output transistor Q5 conductive. As a result, the output terminal 6 becomes low in potential (ground level).

As described above, the output transistor Q5 is conductive or nonconductive in accordance with the amplitude of the unknown voltage input signal Vin relative to that of the reference signal Vref so that the comparison result can be obtained by detecting the potential at the collector of the output transistor Q5 at the output terminal 6.

In the construction of the prior comparator circuit, when Vin<Vref and Vin=0 V, erroneous operation can occur for the following reason. The collector-emitter voltage $V_{CE(Q2)}$ of the transistor Q2 is given by $$V_{CE(Q2)} = Vin + V_{BE(Q2)} - V_{BE(Q5)}$$

where $V_{BE(Q2)}$ and $V_{BE(Q5)}$ are the base-emitter voltage of the transistors Q2 and Q5, respectively. Since $V_{BE(Q2)}$ and $V_{BE(Q5)}$ are substantially equal to each other, when Vin=0 V, $V_{CE(Q2)}$ is almost 0 V. Under this condition, the transistor Q2 fails to operate normally and instead operates as a diode. The current $I_{E1}$ from the constant current source 1 flows into the base of the transistor Q2 but does not flow into the collector. As a result, the transistor Q5 can not maintain its conductive state. Thus, the transistor Q5 operates erroneously.

SUMMARY OF THE INVENTION

Accordingly, the present invention has as an object to provide a comparator circuit which operates normally even when Vin<Vref and Vin=0 V.

According to the present invention, there is provided a comparator circuit comprising operational amplifier means for comparing a reference signal given voltage and an input signal of unknown voltage to produce a signal representing the result of the comparison, first constant current supply means for feeding a constant current to the amplifier means, output transistor means having an input connected to the output of the operational amplifier means, of which the operation is under control of the output signal from the operational amplifier means, and second constant current supply means for feeding a constant current to the input of the output transistor means.

DETAILED DESCRIPTION OF THE PREFERRED EMBODIMENT

Figure 1:
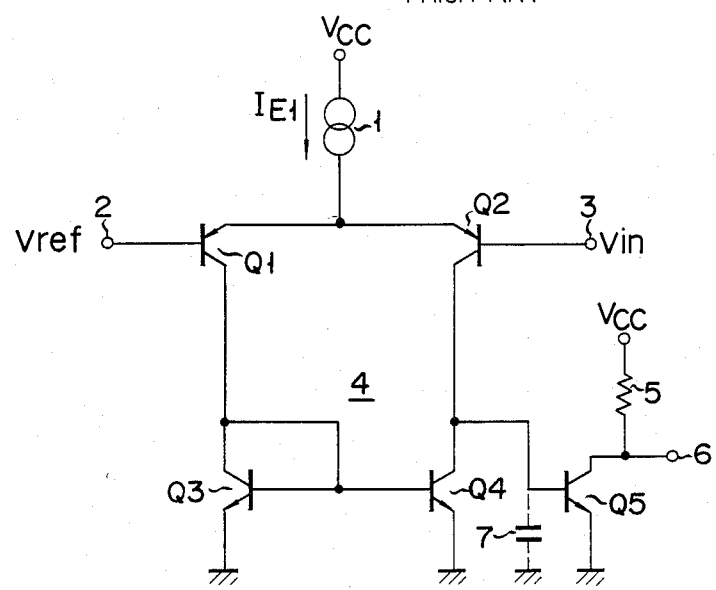
FIG. 1 is a circuit diagram of a prior art comparator circuit.
Figure 2:
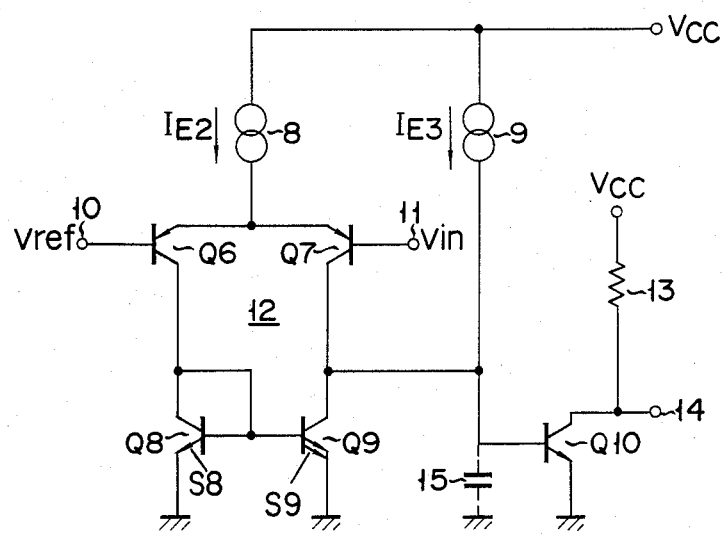
FIG. 2 is a circuit diagram of an embodiment of a comparator circuit according to the present invention.

Reference is made to FIG. 2 illustrating an embodiment of a comparator circuit according to the present invention. The emitters of transistors Q6 and Q7 of PNP type are connected together to a power source for providing a positive potential Vcc (high potential) through a first constant current source 8. The first constant current source 8 may comprise a current mirror circuit, for example. A reference signal at a given voltage Vref is applied to the base of the transistor Q6 through the first input terminal 10. An unknown input signal at a voltage Vin is applied to the base of the transistor Q7 through the second input terminal 11. The collectors of the transistors Q6 and Q7 are connected to the collectors of the NPN transistors Q8 and Q9, respectively. The transistors Q8 and Q9 make up a current mirror circuit. More specifically, the transistors Q8 and Q9 are grounded at the emitters, or coupled with the power source at ground potential (low potential). The bases of those transistors Q8 and Q9 are interconnected. Further, the collector and base of the transistor Q8 are interconnected. With such an arrangement, the transistors Q8 and Q9 constitute a current mirror circuit. The emitter area S9 of the transistor Q9 is set larger than the emitter area S8 of the transistor Q8. Accordingly, the current flowing to the emitter of the transistor Q9 is equivalent to the product of the emitter area and the current flowing into the emitter of the transistor Q8. The transistors Q6 to Q9 make up an operational amplifier 12. The collector of the transistor Q9 serving as the output terminal of the amplifier 12 is connected to the base of the output NPN transistor Q10. The output transistor Q10 is connected at the emitter to ground. Its collector is connected to the power source providing the potential Vcc through the resistor 13. The base of the transistor Q10 is connected to the power source providing the positive potential Vcc through the second constant current source 9.

In the comparator circuit thus constructed, when Vin>Vref, the output transistor Q10 is nonconductive in accordance with its operation mode. On the other hand, when Vin<Vref, the output transistor Q10 is conductive. When Vin<Vref and Vin=0 V, the conductive state of the transistor Q10 is kept, thereby obtaining an accurate comparison result. This will be discussed in detail.

When Vin>Vref, the transistor Q6 is conductive while the transistor Q7 is nonconductive. The current $I_{E2}$ supplied from the constant current source 8 flows through the emitter-collector path of the transistor Q6 and is amplified to be $\alpha I_{E2}$. $\alpha$ is a common emitter current amplification of the transistor Q6. The current $\alpha I_{E2}$ flows through the emitter-collector path of the transistor Q8. The emitter area S9 of the transistor Q9 is larger than the emitter area S8 of the transistor Q8. For example, S8:S9=1:2. The transistor Q9 cooperates with the transistor Q8 to form the current mirror circuit as described above. However, the current, defined by the emitter area ratio multiplied by $\alpha I_{E2}$ (e.g. when the emitter area ratio is given by S8:S9=1:2, the current is multiplied by two), will not flow into the transistor Q9 through the transistor Q7, because the transistor Q7 is nonconductive. No current is fed from the first constant current source 8. Therefore, the current is supplied from the base of the transistor Q10 to the transistor Q9.

The current $I_{E3}$ is supplied from the second constant current source 9 to the base of the transistor Q10. When a relationship between the currents $I_{E2}$ and $I_{E3}$ is set up such that $2\alpha I_{E2} > I_{E3}$, the current $I_{E3}$ from the constant current source 9 and the charge stored in the base of the transistor Q10, more precisely, the charge stored in the stray capacitance 15 equivalently connected between the base of the transistor Q10 and ground in FIG. 2, flows through the transistor Q9. As a result, the base of the transistor Q10 is discharged to a nonconductive state. Accordingly, the potential at the output terminal 14 of the comparator circuit, that is, the collector of the transistor Q10, becomes high, that is, corresponds to a value obtained by subtracting the voltage drop across the resistor 13 from the potential Vcc.

That is, when Vin>Vref, if the following condition is satisfied, the output transistor Q10 is nonconductive.

$$\frac{I_{E3}}{\alpha I_{E2}} \leq m, \ m = \frac{S9}{S8}$$

To obtain stable operation of the circuit, the values of m and $I_{E3}$ must preferably be set up: m=2 and $I_{E3}=I_{E2}$.

When Vin<Vref, the transistor Q6 is nonconductive, while the transistor Q7 is conductive. Therefore, no current flows into the transistor Q8 and therefore the transistor Q9 is also nonconductive. The result is that the current $\alpha I_{E2}$ ($\alpha$ is the common emitter current amplification factor of the transistor Q7) supplied by the constant current source 8 and amplified by the transistor Q7 is supplied to the base of the output transistor Q10. The current $I_{E3}$ from the second constant current source 9 in addition to the current $\alpha I_{E2}$ is applied to the base of the output transistor Q10. The transistor Q10 is conductive and the potential at the output terminal 14 is low in level.

The operation of the comparator circuit, when Vin<Vref and Vin=0, will be described.

In this case, the voltage between the collector and emitter of the transistor Q7 is substantially 0 V. In this condition, the transistor loses its own function and functions as a diode. Accordingly, the current $I_{E2}$ from the first constant current source 8 does not flow into the transistor Q9 but flows into the base of the transistor Q7. The result is that the current from the transistor Q7 is not supplied to the base of the transistor Q10. The constant current $I_{E3}$, however, is constantly supplied from the second constant current source 9 to the base of the output transistor Q10. Under this condition of the circuit, the output transistor Q10 is kept in a conductive state, not in a nonconductive state. Thus, the potential at the output terminal 14 is kept at the low potential.

As described above, in the comparator circuit of the present embodiment, when Vin>Vref, the transistor Q10 is rendered nonconductive. In the inverse condition, i.e. Vin<Vref, the output transistor Q10 is made conductive. Further, even if Vin=0 V when Vin<Vref, no erroneous operation takes place. Consequently, the conductive state of the transistor Q10 can be kept to ensure a correct comparison result.

In the above-mentioned operating condition, if Vin=Vref no switching operation of the output transistor Q10 is performed, and output transistor Q10 is kept conductive. When the difference between Vin and Vref is distinctive, the switching operation is reliably performed. Therefore, no practical problem arises in the above-mentioned embodiment.

In designing the circuit, if $I_{E2}$, $I_{E3}$ and m are selected to satisfy a given condition, the switching operation is allowed even under the condition of Vin=Vref. This will be discussed in detail referring to FIG. 2.

When Vin=Vref, the current $I_{E2}$ supplied from the constant current source 8 is equally shunted into the transistors Q6 and Q7. These shunted and amplified currents $I_{C6}$ and $I_{C7}$ are given $$I_C{^16} = I_{C7} = \frac{1}{2} I_{E2} \cdot \alpha$$

where alpha ($\alpha$) is a common emitter current amplification factor of each of the transistors Q6 and Q7. The common emitter current amplification factor $\alpha$ is expressed by using the DC amplification factor $h_{FE}$ of each of the transistors Q6 and Q7, $$\alpha = h_{FE}/(1+h_{FE})$$

The current $I_{E9}$ flowing into the transistor Q9, since the transistors Q8 and Q9 constitute a current mirror circuit, is $$I_{E9} = mI_{C6} = \frac{1}{2} I_{E2} \cdot \alpha \cdot m$$

The current $I_{E9}$ is the sum of the current $I_{C7}$ flowing into the transistor Q7 and the second constant current $I_{E3}$, and is expressed by $$I_{E9} = I_{C7} + I_{E3}$$

Rearranging the above equation with respect to the current $I_{E3}$, we have $$I_{E3} = I_{E9} - I_{C7}$$

This equation indicates that the switching operation of the transistor Q10, when Vin=Vref, is allowed by selecting the current $I_{E3}$ to be the difference between the currents $I_{E9}$ and the $I_{C7}$. The current $I_{E3}$, when using $I_{E2}$ and m, is expressed $$\begin{aligned} I_{E3} &= I_{E9} - I_{C7} \\ &= \frac{1}{2} I_{E2} \cdot \alpha \cdot m - \frac{1}{2} I_{E2} \cdot \alpha \\ &= \frac{1}{2} I_{E_2}\alpha(m-1) \end{aligned}$$

Thus, the switching of the transistor Q10 is allowed when Vin=Vref by feeding from the constant current source 9 the current $I_{E3}$ expressed by the equation as just mentioned. Generally, $\alpha \approx 1$ and preferably m=2. Under this condition, the current $I_{E3}$ is $$I_{E3} = \frac{1}{2} I_{E2}$$

This implies that, to effect the switching of the transistor Q10 under such a condition, the current $I_{E3}$ fed from the constant current source 9 must be ½ the current $I_{E2}$ fed from the constant current source 8.

As described above, when Vin>Vref, the transistor Q10 is nonconductive. When Vin<Vref, it is conductive. Even if Vin=0 V when Vin<Vref, the transistor Q10 keeps its conductive state. Further, even when Vin=Vref, the switching operation of the output transistor Q10 is allowed. In this way, a reliable comparing operation of the comparator circuit is ensured free from error.

While the emitter area ratio of the transistors Q8 and Q9 is preferably 1:2 in the above embodiment, the emitter area ratio is of course not limited to such value.

In the above embodiment, the transistors Q6 and Q7 are of PNP type and the transistors Q8 and Q10 are of NPN type. The conductivity types of these transistors may be reversed, if the polarity of the power sources applied to them are correspondingly reversed.

It should be understood that the present invention may be variously modified and changed within the spirit of the present invention.

What is claimed is:

1. A comparator circuit comprising:
   comparison means, in the form of an operational amplifier, for comparing a first input signal at a reference voltage and a second input signal at an unknown voltage, said comparison means including a current mirror circuit having first and second transistors connected base-to-base such that the conduction state of said transistors is controlled by the relative values of said first and second input signals;
   first constant current means for supplying a first constant current to said current mirror circuit when the latter is in a predetermined conduction state;
   output control means, comprising an output transistor connected to the collector of said second transistor, for controlling the output of said comparator circuit;
   second constant current means also connected to the collector of said second transistor for supplying a second constant current to said output control means to cause the latter to represent a first comparison result, said current mirror circuit operating in said predetermined conduction state to divert said second constant current through said second transistor whereby said output control means switches to represent a second comparison result; and wherein
   said comparison means in the form of an operational amplifier further including third and fourth transistors of a first conductivity type, said first and second transistors being of a second conductivity type and being interconnected with said third and fourth transistors, respectively, to form first and second series circuits;
   said first and second series circuits are connected at one end to said first constant current means and at the other end to a power source;
   said first input signal is applied to the base of said third transistor and said second input signal is applied to the base of said fourth transistor;
   the collector and the base of said first transistor are interconnected; and
   the emitter area of said second transistor is larger than the emitter area of said first transistor, with the ratio of the emitter area of said second transistor to the emitter area of said first transistor being greater than or equal to the value obtained by dividing the value of the current from said second constant current means by the product of the value of the current from said first constant current means and the common emitter current amplification factor for each of said third and fourth transistors.

2. A comparator circuit according to claim 2 wherein:
   the value of the current from said second constant current means is equal to one half the value of the current from said first constant current means whenever said common emitter current amplification factor is substantially equal to one; and
   the ratio of the emitter area of said second transistor to the emitter area of said first transistor is substantially equal to two.

3. A comparator circuit comprising:
   comparison means, in the form of an operational amplifier, for comparing a first input signal at a reference voltage and a second input signal at an unknown voltage, said comparison means including a current mirror circuit having first and second transistors connected base-to-base such that the conduction state of said transistors is controlled by the relative values of said first and second input signals;

first constant current means for supplying a first constant current to said current mirror circuit when the latter is in a predetermined conduction state;

output control means, comprising an output transistor connected to the collector of said second transistor, for controlling the output of said comparator circuit;

second constant current means also connected to the collector of said second transistor for supplying a second constant current to said output control means to cause the latter to represent a first comparison result, said current mirror circuit operating in said predetermined conduction state to divert said second constant current through said second transistor whereby said output control means switches to represent a second comparison result;

said comparison means in the form of an operational amplifier further including third and fourth transistors of a first conductivity type, said first and second transistors being of a second conductivity type and being interconnected with said third and fourth transistors, respectively, to form first and second series circuits;

said first and second series circuits are connected at one end to said first constant current means and at the other end to a power source;

said first input signal is applied to the base of said third transistor and said second input signal is applied to the base of said fourth transistor;

the collector and the base of said first transistor are interconnected;

the emitter area of said second transistor is larger than the emitter area of said first transistor; and the value of the current from said second constant current means is equal to one half the product of the value of the current from said first constant current means, and the common emitter current amplification factor for each of said third and fourth transistors and the ratio of the emitter area of said first transistor to the emitter area of said second transistor is less one.

* * * * *